United States Patent
Song

(10) Patent No.: US 6,680,238 B2
(45) Date of Patent: Jan. 20, 2004

(54) METHOD FOR MANUFACTURING A SEMICONDUCTOR DEVICE

(75) Inventor: Woon-young Song, Seongnam-shi (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 47 days.

(21) Appl. No.: 10/321,919

(22) Filed: Dec. 17, 2002

(65) Prior Publication Data

US 2003/0113978 A1 Jun. 19, 2003

(30) Foreign Application Priority Data

Dec. 18, 2001 (KR) .................................. 2001-0080861

(51) Int. Cl.$^7$ ............................................. H01L 21/76
(52) U.S. Cl. ....................... 438/424; 438/425; 438/427; 438/429
(58) Field of Search ................................. 438/413, 416, 438/424, 425, 426, 429, 442, 427

(56) References Cited

U.S. PATENT DOCUMENTS

| | | | | |
|---|---|---|---|---|
| 4,745,081 A | * | 5/1988 | Beyer et al. | 438/429 |
| 5,130,268 A | * | 7/1992 | Liou et al. | 438/425 |
| 5,384,280 A | * | 1/1995 | Aoki et al. | 438/425 |
| 5,937,286 A | | 8/1999 | Abiko | 438/218 |
| 6,020,230 A | | 2/2000 | Wu | 438/222 |
| 6,486,039 B2 | * | 11/2002 | Yoo et al. | 438/425 |
| 6,518,146 B1 | * | 2/2003 | Singh et al. | 438/427 |
| 2002/0070420 A1 | * | 6/2002 | Oh et al. | 257/506 |

FOREIGN PATENT DOCUMENTS

JP 11-097519 4/1999 ........... H01L/21/76

* cited by examiner

Primary Examiner—T. N. Quach

(57) ABSTRACT

A method for manufacturing a semiconductor device includes the steps of: sequentially forming a pad oxide layer, a nitride layer and a first photoresist layer on the semiconductor substrate; patterning the first photoresist layer into a predetermined shape to form a first photoresist layer pattern; etching the pad oxide layer, the nitride layer and the semiconductor substrate by using the first photoresist layer pattern as an etching mask, thereby forming first and second deep trench isolations in the semiconductor substrate; forming a barrier layer on an inside wall of the second deep trench isolation by performing a nitriding process after removing the first photoresist layer pattern and forming a second photoresist layer pattern at a region formed with the first deep trench isolation on the resultant material; and forming a shallow trench isolation by removing the second photoresist layer pattern and then growing silicon in the first deep trench isolation region covered with the second photoresist layer pattern by performing a silicon epitaxial growth process.

5 Claims, 3 Drawing Sheets

METHOD FOR MANUFACTURING A SEMICONDUCTOR DEVICE

BACKGROUND

1. Technical Field

Methods for manufacturing semiconductor devices and, more particularly, methods for manufacturing semiconductor devices are disclosed which are capable of forming a shallow trench isolation and a deep trench isolation in a straight line of the same substrate by using only one etching process without an any additional etching process when the shallow trench isolation and the deep trench isolation are formed to form a trench with an appropriate depth on the semiconductor substrate and fill an insulating layer within the trench.

2. Description of the Related Art

As the degree of integration of semiconductor devices increases, the design rule is reduced. Accordingly, a conventional device isolation method such as local oxidation of silicon (LOCOS), R-LOCOS (Recessed LOCOS), PSI (Partial Si Etch Isolation), PBL (Poly-Buffered LOCOS) and the like has reached to a critical point since the size of a device isolation layer to isolate between semiconductor devices is scaled down by the same scale.

In order to solve the above-described problem, deep trench isolation (hereinafter, DTI) has been introduced as a further isolation technique.

More recently, device isolation layers have been formed by utilizing simultaneously a shallow trench isolation (STI) and DTI to isolate between semiconductor devices.

FIGS. 1a to 1c are cross-sectional views in sequence for representing a conventional method for forming a device isolation layer of a semiconductor device.

As shown in FIG. 1a, after a first photoresist layer 20 is deposited on a semiconductor substrate 10 with a predetermined substructure, a first photoresist layer 20 having a predetermined shape is obtained by patterning the first photoresist layer 20 into the predetermined shape to form a plurality of STIs 30. Then, the plurality of STIs 30 are formed in the semiconductor substrate 10 by etching the semiconductor substrate 10 to a first predetermined depth using the first photoresist layer 20 having a predetermined shape as a mask.

Thereafter, as shown in FIG. 1b, after the first photoresist layer 20 having the predetermined shape is removed, a second photoresist layer 40 is formed on the semiconductor substrate 10 from which the first photoresist layer 20 having the predetermined shape is removed. Subsequently, the second photoresist layer 40 of the predetermined shape is obtained by pattering the second photoresist layer 40 into the predetermined shape to form a DTI.

Also, a predetermined region of the semiconductor substrate 10 formed with the STIs 30 is etched deeper as compared to the previous etching process by using the second patterned photoresist layer 40 as a mask, thereby forming the DTI 50.

As shown in FIG. 1c, by removing the second photoresist layer 40 the STI 30 and the DTI 50 are formed on the semiconductor substrate 10.

However, during the second etching process, if the pattern of the second photoresist layer 40 does not match the profile of the STI 30, there is a problem that the STI 30 and the DTI 50 cannot be formed on a straight line since the STI 30 and the DTI 50 are mismatched in an "A", as shown in FIG. 1c.

Also, the inside of the STI 30 and the DTI 50 are damaged by plasma generated during the first and second etching processes.

SUMMARY OF THE DISCLOSURE

To solve the above-mentioned problems associated with conventional methods for manufacturing semiconductor devices, a method for manufacturing a semiconductor device is disclosed which is capable of simplifying a semiconductor isolation forming process as well as minimizing damage caused from plasma to form a shallow trench isolation and a deep trench isolation on a straight line of the same substrate using only one etching process without any additional etching process when the shallow trench isolation and the deep trench isolation are formed to form a trench with an appropriate depth on the semiconductor substrate and fill an insulating layer within the trench.

One disclosed method for manufacturing a semiconductor device comprises forming first and second deep trench isolations within a semiconductor substrate by performing an etching process using a first photoresist layer pattern formed at a predetermined region on the semiconductor substrate in which a pad oxide layer and a nitride layer are sequentially formed; forming a barrier layer on an inside wall of the second deep trench isolation by performing a nitriding process after removing the first photoresist layer pattern and forming a second photoresist layer pattern at a region formed with the first deep trench isolation on the resultant material; and forming a shallow trench isolation by removing the second photoresist layer pattern and then growing silicon in the first deep trench isolation region covered with the second photoresist layer pattern by performing a silicon epitaxial growth process.

In the disclosed methods, a barrier layer made of an oxide or nitride is formed by processing at low power and low pressure in a chamber in which the processes of forming and etching the deep trench isolation is performed and silicon in the deep trench isolation is grown by maintaining a furnace at a temperature ranging from about 500° C. to about 1100° C.

BRIEF DESCRIPTION OF DRAWINGS

The above features and advantages of the disclosed methods will become more apparent from the following detailed description when taken in conjunction with the accompanying drawings, wherein.

DETAILED DESCRIPTION OF THE PRESENTLY PREFERRED EMBODIMENTS

A preferred embodiment will now be described with reference to the accompanying drawings.

Figure 1A:
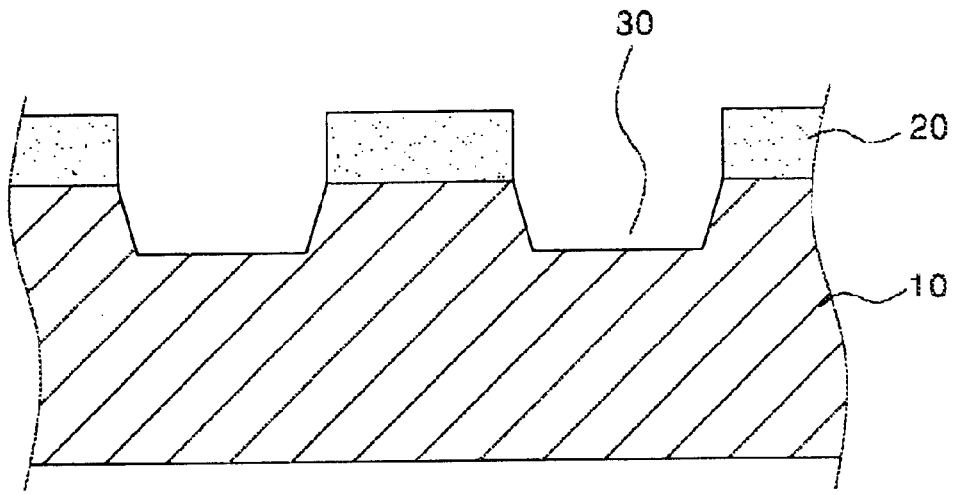
FIGS. 1A, 1B, and 1C are cross-sectional views in sequence for representing a conventional method for forming a device isolation layer of a semiconductor device.
Figure 1B:
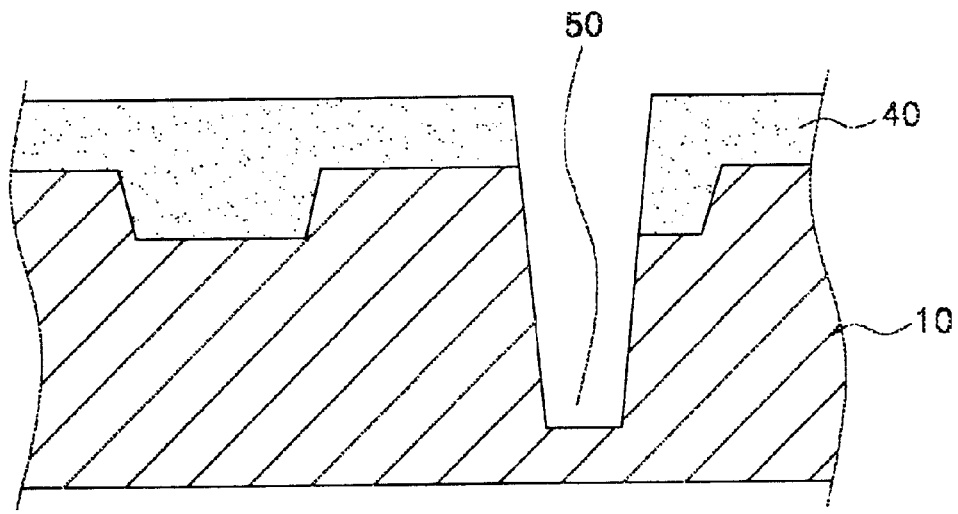
Figure 1C:
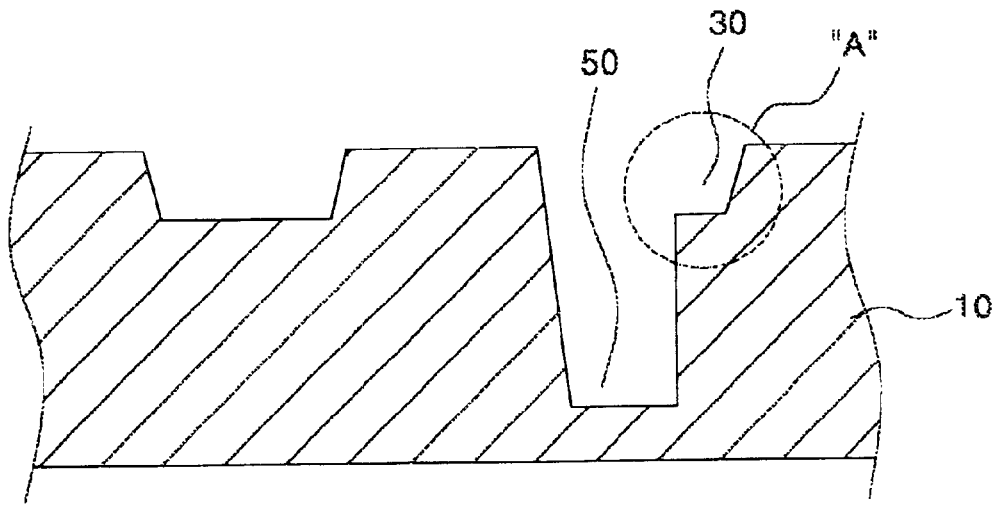
Figure 2A:
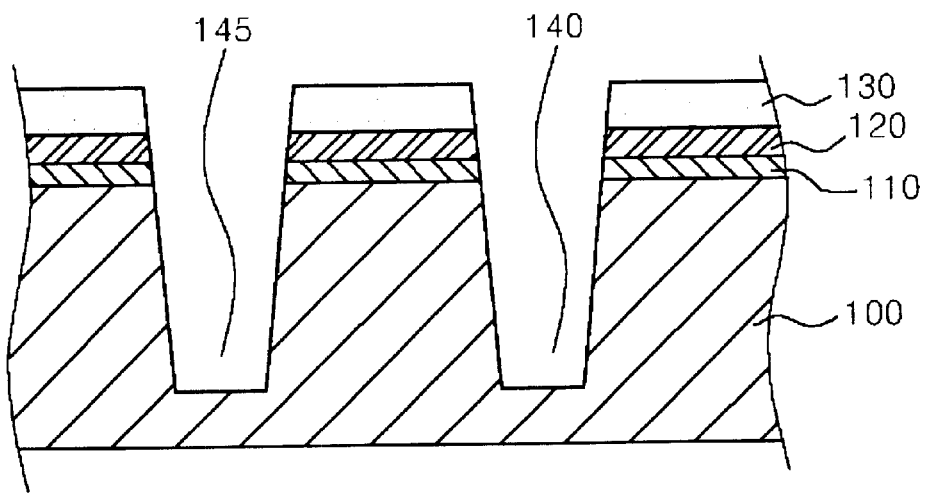
FIGS. 2A, 2B, and 2C are cross-sectional views in sequence for representing a disclosed method for forming a semiconductor device.
Figure 2B:
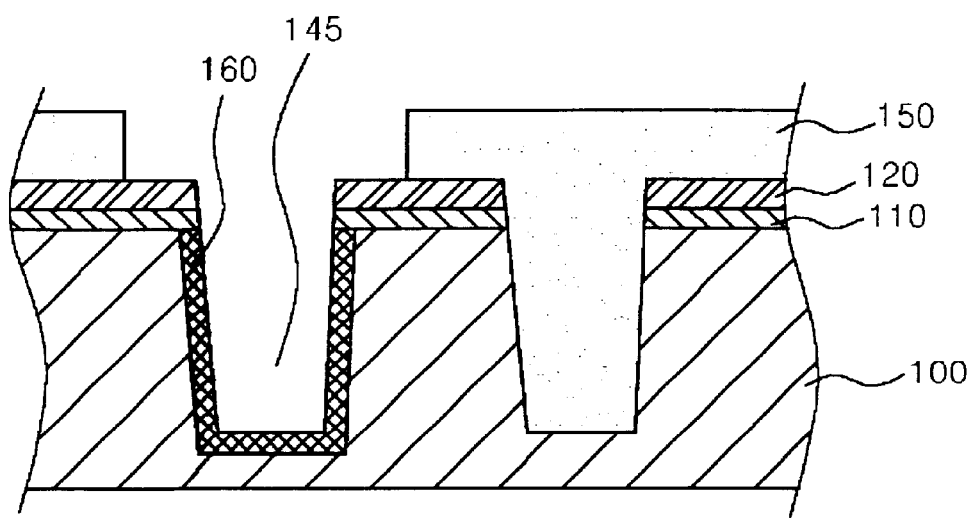
Figure 2C:
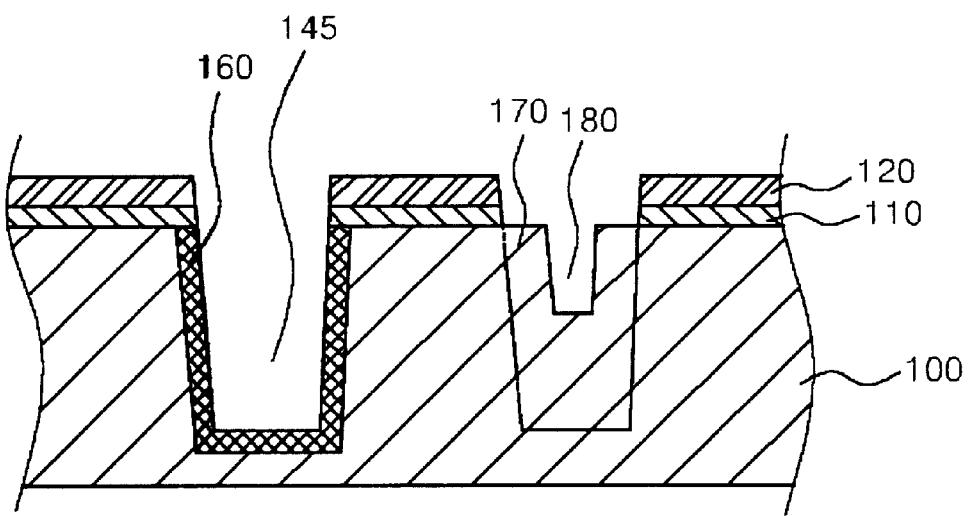

FIGS. 2a to 2c are cross-sectional views in sequence for representing a method for forming a semiconductor device in accordance with the preferred embodiment.

As shown in FIG. 2a, a pad oxide layer 110 and a nitride layer 120 are sequentially formed on a semiconductor substrate 100. After a first photoresist layer is formed on the nitride layer 120, the first photoresist layer is patterned into a first predetermined shape to form a deep trench isolation forming area on a predetermined region of the nitride layer 120, thereby obtaining a first photoresist layer pattern 130.

Also, the nitride layer 120, the pad oxide layer 110 and the semiconductor substrate 100 are sequentially etched by using the first photoresist layer pattern 130 as an etching mask, thereby forming first and second deep trench isolations (DTIs) 140 and 145 in the semiconductor substrate 100.

In the next step, as shown in FIG. 2b, after the first photoresist layer pattern 130 is removed, a second photoresist layer is formed on the nitride layer 120 from which the first photoresist layer pattern 130 is removed. Then, a second photoresist layer pattern 150 with a second predetermined shape is formed by patterning the second photoresist layer into the second predetermined shape. Here, the second photoresist layer pattern 150 is formed in such a way that it remains only at the first deep trench isolation 140 area among the previously formed first and second deep trench isolations 140 and 145, whereby the second photoresist layer pattern 150 covers a region of the first deep trench isolation 140 and exposes a region of the second deep trench isolation 145.

Thereafter, in a chamber that has implemented the processes of forming and etching the first and second deep trench isolations 140 and 145, a nitriding process is performed on the semiconductor substrate in which only the portion in which the shallow trench isolation to be formed is covered with the second photoresist layer pattern 150, by supplying a nitrogen gas at an RF power ranging from about 50 W to about 300 W and at a pressure ranging from about 0.1 to about 10 mTorr.

At this time, the nitrogen gas penetrates into the region of the second deep trench isolation 145 not covered with the second photoresist layer pattern 150 during the nitriding process to thus form a barrier layer 160 in an inside wall of the region of the second deep trench isolation 145, wherein the barrier layer 160 may be made of an oxide or nitride.

Also, as shown in FIG. 2c, the second photoresist layer pattern (not shown) is removed. Then, on the semiconductor substrate 100 from which the second photoresist layer pattern is removed is performed an elevated Si layer (ESL) process as a silicon epitaxial growth process in a furnace at a temperature ranging from about 500° C. to 1100° C. to grow a silicon within the region of the first deep trench isolation 140 covered with the second photoresist layer pattern to a desired height, thereby forming a growth silicon layer 170 in the first deep trench isolation (not shown) to form a shallow trench isolation 180 on a straight line with the previously formed second deep trench isolation 145.

While the disclosed methods have been described with respect to the preferred embodiments, other modifications and variations may be made without departing from the spirit and scope of this disclosure as set forth in the following claims.

Therefore, as described above, by utilizing the method for manufacturing a semiconductor device in accordance with this disclosure, it is possible to form a shallow trench isolation and a deep trench isolation on a straight line of the same substrate by using only one etching process without an additional etching process when the shallow trench isolation and the deep trench isolation are formed to form a trench with an appropriate depth on the semiconductor substrate and fill an insulating layer within the trench. As a result, there are advantages of simplifying the semiconductor isolation forming process as well as minimizing damage caused from the plasma.

Also, the disclosed methods can control the field area and active regions by controlling the degree of nitriding in the deep trench isolation region as well as by controlling the ESL process as a silicon epitaxial growth process, thereby obtaining an active region and a field region which easily adapt to the characteristics for each device.

What is claimed is:

1. A method for manufacturing a semiconductor device comprises:

sequentially forming a pad oxide layer, a nitride layer and a first photoresist layer on a semiconductor substrate;

patterning the first photoresist layer into a predetermined shape to form a first photoresist layer pattern;

etching the pad oxide layer, the nitride layer and the semiconductor substrate by using the first photoresist layer pattern as an etching mask, thereby forming first and second deep trench isolation regions in the semiconductor substrate;

removing the first photoresist layer pattern and forming a second photoresist layer pattern over the first deep trench isolation region and then forming a barrier layer on an inside wall of the second deep trench isolation region by performing a nitriding process;

forming a shallow trench isolation by removing the second photoresist layer pattern and then growing silicon in the first deep trench isolation region covered with the second photoresist layer pattern by performing a silicon epitaxial growth process.

2. The method of claim 1, wherein the barrier layer is made of an oxide layer.

3. The method of claim 1, wherein the barrier layer is made of a nitride layer.

4. The method of claim 1, wherein the nitriding process is performed at a pressure ranging from about 0.1 to about 10 mTorr while maintaining an RF power ranging from about 50 W to about 300 W.

5. The method of claim 1, wherein a furnace is maintained at a temperature ranging from 500° C. to 1100° C. during the silicon epitaxial growth process.

* * * * *

UNITED STATES PATENT AND TRADEMARK OFFICE
CERTIFICATE OF CORRECTION

PATENT NO.     : 6,680,238 B2
DATED          : January 20, 2004
INVENTOR(S)    : Woon-young Song It is certified that error appears in the above-identified patent and that said Letters Patent is hereby corrected as shown below:

<u>Title page,</u>
Item [75], Inventor, please delete "Seongnam-shi" and insert -- Kyunggi-do -- in its place.

Signed and Sealed this

Fourth Day of May, 2004

JON W. DUDAS
*Acting Director of the United States Patent and Trademark Office*